(12) United States Patent
Pelekhaty et al.

(10) Patent No.: US 9,835,880 B2
(45) Date of Patent: *Dec. 5, 2017

(54) DRIVER AND CAPACITIVE LOAD INTEGRATION

(71) Applicants: Vladimir Pelekhaty, Baltimore, MD (US); Michael Y. Frankel, Baltimore, MD (US)

(72) Inventors: Vladimir Pelekhaty, Baltimore, MD (US); Michael Y. Frankel, Baltimore, MD (US)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,939

(22) Filed: Aug. 9, 2016

(65) Prior Publication Data

US 2016/0357033 A1 Dec. 8, 2016

Related U.S. Application Data

(63) Continuation of application No. 14/733,678, filed on Jun. 8, 2015, now Pat. No. 9,436,019.

(51) Int. Cl.
*G02B 7/00* (2006.01)
*G02F 1/01* (2006.01)
*H01L 41/09* (2006.01)

(52) U.S. Cl.
CPC .......... *G02F 1/0121* (2013.01); *H01L 41/09* (2013.01)

(58) Field of Classification Search
CPC ..... G02F 1/0121; G02F 1/13452; H01L 41/09
USPC ........ 359/238, 264, 896; 327/110, 334, 355; 398/173, 182, 202; 349/149
See application file for complete search history.

(56) References Cited

U.S. PATENT DOCUMENTS

| | | | |
|---|---|---|---|
| 3,879,687 A | 4/1975 | Daehlin et al. | |
| 5,189,547 A | 2/1993 | Day et al. | |
| 6,825,964 B2 | 11/2004 | Singh et al. | |
| 8,150,270 B2 * | 4/2012 | Bonthron | H03F 3/45089 398/182 |

OTHER PUBLICATIONS

Ying-Hao Kuo et al., "High Speed hybrid silicon evanescent electroabsorption modulator", Optics Express, vol. 16, No. 13, pp. 9936-9941, Jun. 23, 2008 (6 pages).

(Continued)

*Primary Examiner* — Tuyen Tra

(57) ABSTRACT

A circuit that may include a circuit network and a transmission line coupled to the circuit network. The circuit network may include an electro-optic modulator and various inductors. The electro-optic modulator may be a capacitive load having a predetermined capacitance. The circuit may further include a resistor coupled to the circuit network. The resistor may have a resistance value configured to produce a first impedance with the circuit network. The first impedance may be configured to match substantially with a second impedance in the transmission line. The circuit may further include an electric driver couple to the transmission line. The electric driver may be configured for transmitting a driving voltage to the electro-optic modulator. The driving voltage may be configured to generate a predetermined voltage swing across the electro-optic modulator.

18 Claims, 6 Drawing Sheets

(56) References Cited

OTHER PUBLICATIONS

Taizo Tatsumi et al., "Development of Electro-Absorption Modulator Driver ICs for 25G/40G Transmission", SEI Technical Review, No. 74, pp. 66-70,Apr. 2012 (5 pages).
S. S. Mohan et al., "Bandwidth Extension in CMOS with Optimized On-Chip Inductors", IEEE Journal of Solid-State Circuits, vol. 35, No. 3 pp. 346-355, Mar. 2000 (10 pages).
B. Analui and Ali Hajimiri, "Bandwidth Enhancement for Transimpedance Amplifiers", IEEE Journal of Solid-State circuits, vol. 39, No. 8, pp. 1263-1370, Aug. 2004 (8 pages).
S. S. Shekhar et al., "Bandwidth Extension Techniques for CMOS Amplifiers", IEEE Journal of Solid-State Circuits, vol. 41, No. 11, pp. 2424-2439, Nov. 2006 (16 pages).
Thomas H. Lee, "Planar Microwave Engineering: A Practical Guide to Theory, Measurement, and Circuits", Cambridge University Press 2004 (29 pages).

\* cited by examiner

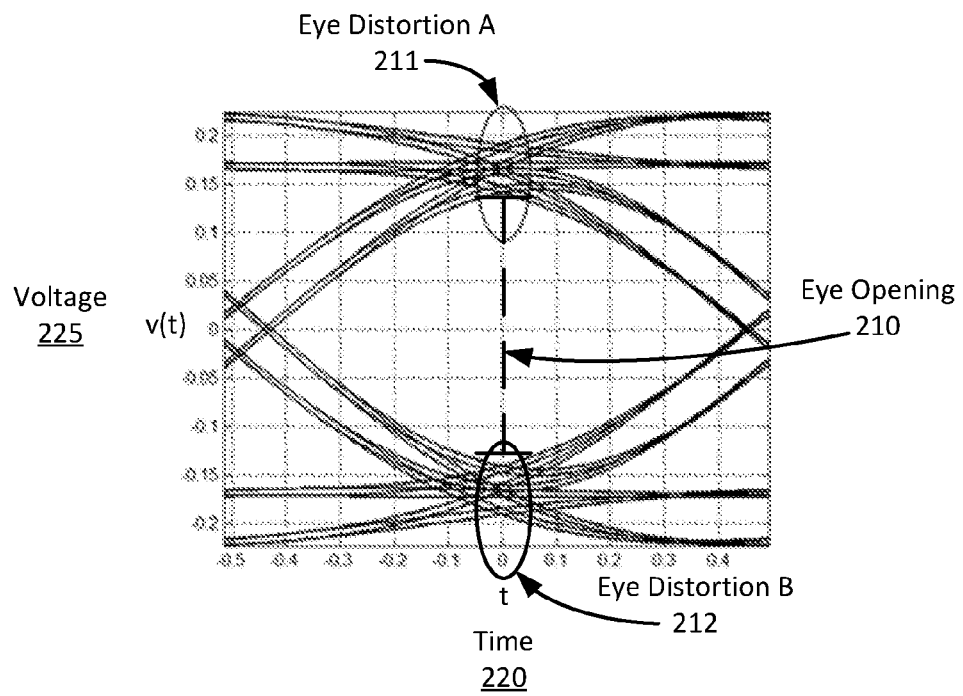
FIG. 2.1
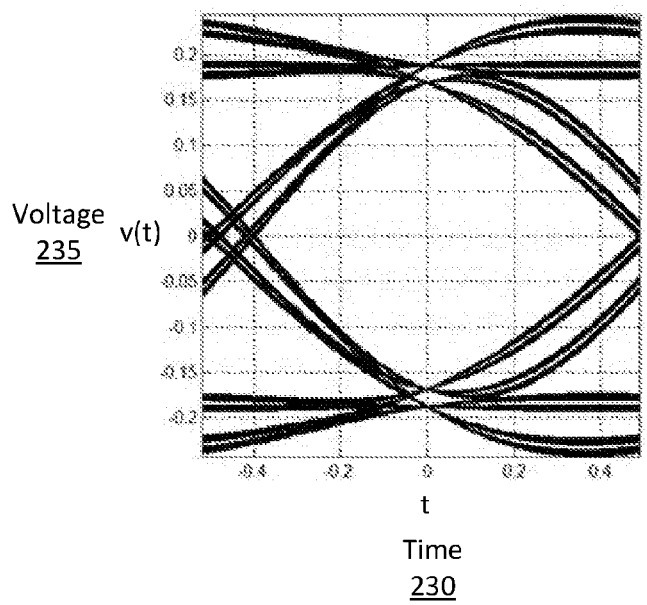
FIG. 2.2

US 9,835,880 B2

DRIVER AND CAPACITIVE LOAD INTEGRATION

CROSS REFERENCE TO RELATED APPLICATIONS

This application is a continuation of and claims benefit under 35 U.S.C. §120 to U.S. application Ser. No. 14/733,678, filed Jun. 8, 2015, which is incorporated herein by reference in its entirety.

BACKGROUND

Electrical circuits may include various terminals for connecting various electrical loads. For instance, an electric transducer on an electrical circuit may act as a capacitive load that uses electric energy to perform work. A particular electrical load may have a particular impedance that may generate an electrical reflection to other electrical components if unmatched at the terminals.

SUMMARY

In general, in one aspect, embodiments relate to a circuit that includes a circuit network and a transmission line coupled to the circuit network. The circuit network further includes an electro-optic modulator and various inductors. The electro-optic modulator is a capacitive load having a predetermined capacitance. The circuit further includes a resistor coupled to the circuit network. The resistor includes a resistance value configured to produce a first impedance with the circuit network. The first impedance is configured to match substantially with a second impedance in the transmission line. The circuit network further includes an electric driver coupled to the transmission line. The electric driver is configured for transmitting a driving voltage to the electro-optic modulator. The driving voltage is configured to generate a predetermined voltage swing across the electro-optic modulator.

In general, in one aspect, embodiments relate to a circuit that includes a capacitive load. The capacitive load includes an electro-optic modulator, and the capacitive load is configured with a predetermined capacitance. The circuit further includes an electric driver configured for transmitting a driving voltage to the capacitive load. The driving voltage is configured to generate a predetermined voltage swing across the electro-optic modulator. The circuit further includes a first inductor-and-capacitor (LC) ladder network compensation circuitry and a second LC ladder network compensation circuitry. The first LC ladder network compensation circuitry and the second LC ladder network compensation circuitry are configured for matching the electric driver with the capacitive load.

Other aspects of the invention will be apparent from the following description and the appended claims.

BRIEF DESCRIPTION OF DRAWINGS

FIGS. 2.1 and 2.2 show eye diagrams in accordance with one or more embodiments.

DETAILED DESCRIPTION

Figure 1:
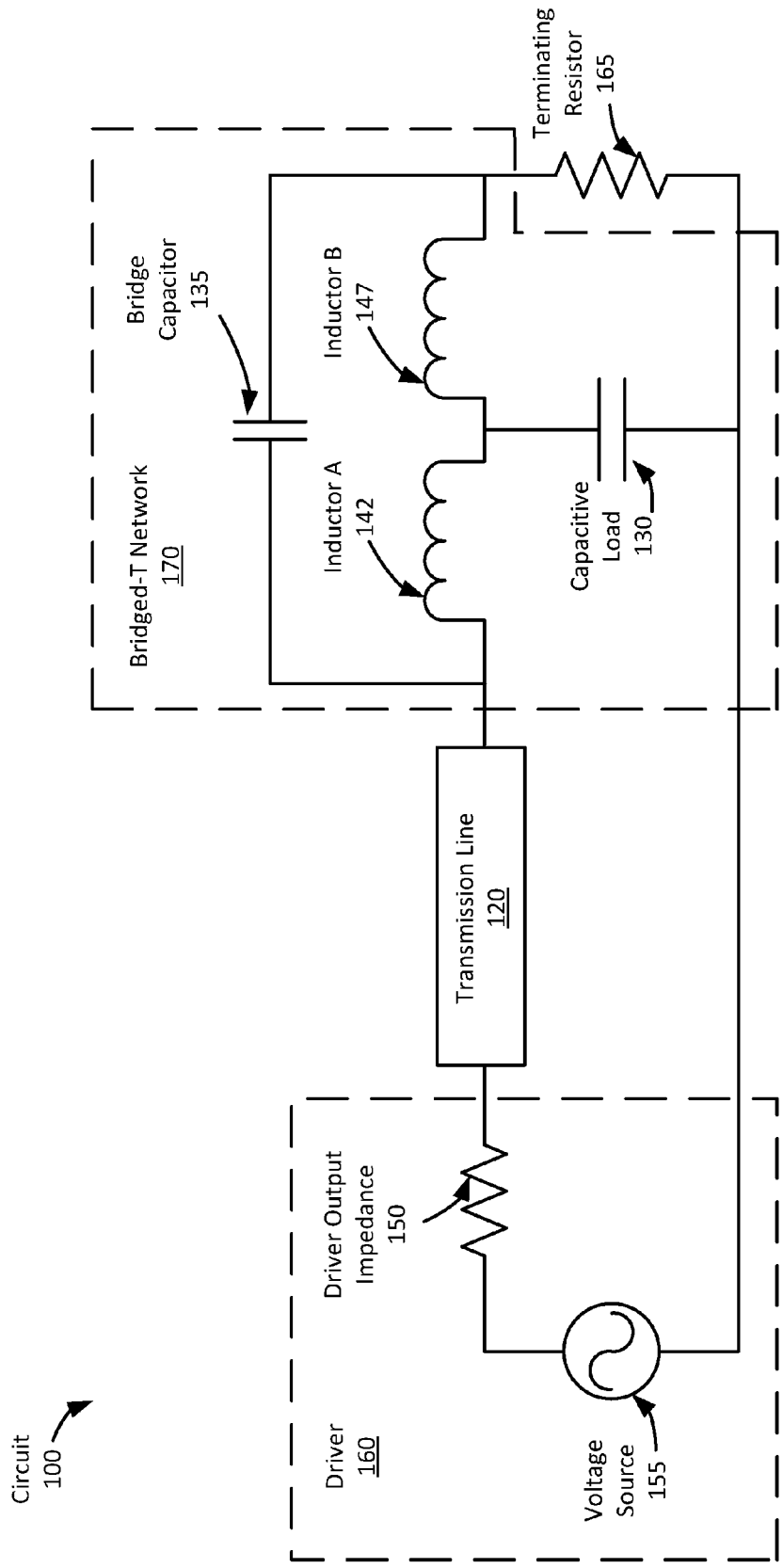
FIG. 1 shows a system in accordance with one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

HYBRID INTEGRATION OF A DRIVER AND CAPACITIVE LOAD

In general, embodiments of the invention include various circuits for accommodating the increasing capacitance of a capacitive load. The capacitive load may include an electro-optic modulator or other type of load that experiences increased performance based on increased capacitance. The circuits may include an electric driver for providing a driving voltage across the capacitive load. As such, the circuits may be configured with one or more transmission lines configured for interconnecting the electric driver with a bridged-T network having the capacitive load embedded within the bridged-T network. The circuits may be configured with one or more inductor-and-capacitor (LC) ladder networks for matching the capacitive load with the electric driver.

FIG. 1 shows a schematic of a circuit (100) in accordance with one or more embodiments. In one or more embodiments, the circuit (100) includes a driver (e.g., driver (160)), a transmission line (e.g., transmission line (120)), and a bridged-T network (e.g., bridged-T network (170)) having an embedded capacitive load (e.g., capacitive load (130)). In one or more embodiments, the driver may include a voltage source (e.g., voltage source (155)) and a driver output impedance (e.g., driver output impedance (150)). In one or more embodiments, the bridged-T network is a circuit network that may include a bridge capacitor (e.g., bridge capacitor (135)), and various inductors (e.g., Inductor A (142) and Inductor B (147)). In one or more embodiments, the circuit (100) includes a terminating resistor (e.g., terminating resistor (165)). In one or more embodiments, the terminating resistor is configured with a resistance value selected to reduce the electrical reflections from the bridged-T network towards the driver. In one or more embodiments, the inductors have no mutual coupling in the circuit (100). In one or more embodiments, the circuit (100)

includes passive circuit elements as used in an integrated circuit (e.g., a complementary metal-oxide semiconductor (CMOS)).

The driver (160) may be configured for providing electric voltage to the capacitive load (130) through the transmission line (120). For example, the driver (160) may generate using the voltage source (155) a driver voltage across the capacitive load (130) at a specific range of frequencies, such as to generate a digital signal above 20 Gigabits per second at a particular transducer or electro-optic modulator. In one or more embodiments, the driver (160) may be an amplifying transistor that acts as a current source in the circuit (100). Within the circuit (100), the driver (160) may have a driver output impedance (150) that is configured for matching with the transmission line (120) (e.g., a driver output impedance of 50Ω may match with a transmission line of 50Ω). Specifically, the driver (160) may be mounted in an assembly and positioned from the capacitive load (130) by a particular distance in the assembly. In one or more embodiments, the assembly is a printed circuit board. As such, the transmission line (120) may have a specific length that spans a portion of the particular distance between various components of the circuit (100). The materials of the transmission line (120) may be configured to produce a specific impedance over the specific length.

Various types of transmission lines may be used for the transmission line (120). For example, the transmission line (120) may be a microstrip or a stripline. In one or more embodiments, the transmission line (120) is a tapered transmission line. A tapered transmission line may have different impedances depending on the particular end of the tapered transmission line, e.g., on the side of the driver (160) or side of the capacitive load (130). By using a tapered transmission line, the impedance on the side of the capacitive load (130) may be larger or smaller than the impedance on the side of the driver (160). For more information regarding tapered transmission lines, see FIG. 4.

In one or more embodiments, the transmission line (120) is matched to the bridged-T network (170) to suppress the electrical reflection from the bridged-T network (170) back towards the driver (160). For example, the impedance of the capacitive load (130) and adjacent components may differ from the impedance at the end of the transmission line (120) to produce a particular mismatch. As such, the particular component values may be configured to suppress the electrical reflection down to a predefined relative level, e.g., the circuit (100) may produce a reflection towards the driver (160) at a fixed level of under −10 dB In one or more embodiments, the capacitive load (130) includes an electro-optic modulator. The electro-optic modulator may modulate optical waves in response to an input voltage (e.g., from the driver (160)). Using the electro-optic effect, for example, the electro-optic modulator may modulate an optical wave with a particular phase, wavelength, amplitude and/or polarization. Furthermore, the electro-optic modulator may modulate optical waves with a particular optical modulation format, such as intensity modulation, where optical waves may be transmitted that represent a binary bit '1' and the absence of an optical wave transmission may represent the binary bit '0' (also called on/off keying (OOK) or non-return to zero (NRZ)). Other optical modulation formats generated by the electro-optic modulator may include return-to-zero (RZ) modulation or phase shift keying (i.e., PSK modulation). Various types of electro-optic modulators may be used in the circuit (100), such as an electro-absorption modulator (EAM), a metal-oxide-semiconductor capacitor (MOSCAP), a ring modulator, or a segmented Mach-Zehnder modulator.

Furthermore, an electro-optic modulator may have an electrical-to-optical conversion efficiency for converting electrical signals to optical waves. As such, the conversion efficiency may be directly proportional to the capacitance of the electro-optic modulator. For example, increasing a strength of a modulating electric field may increase optical modulation for the same applied voltage. In one or more embodiments, increased modulating electric field strength is achieved by reducing the gap between various electrodes in the electro-optic modulator. In one or more embodiments, for example, the electro-optic modulator is a Si-based depletion modulator. With a Si-based depletion modulator, an optical response may be proportional to a modulated charge corresponding to the Si-based depletion modulator's capacitance. To increase the electric field that modulates the overlapping optical mode and improve modulator efficiency, the electrode separation may be reduced in Si-based depletion modulator, which also increases the capacitance.

An electro-optic modulator may be characterized by a particular optical modulation amplitude (OMA). The optical modulation amplitude is the difference between two optical power output levels used for producing a corresponding optical digital signal with the electro-optic modulator. For example, one optical power output level may correspond to the 'on' state of the electro-optic modulator, while another optical power output level may correspond to the 'off' state of the electro-optic modulator. In the 'on' state, the electro-optic modulator may cause a high transmission at an optical source or optical transmitter. In the 'off' state, the electro-optic modulator may cause a low or no transmission from the same optical source. As such, the OMA is preferred to be approximately constant in a particular circuit to provide a fixed optical swing from the electro-optic modulator. The optical modulation amplitude may be expressed by the following equation:

$$OMA = \eta CV_{ss} EO_{CAP} \qquad \text{Equation 1}$$

Where η is the conversion efficiency of the capacitive load (130) (e.g., the electrical-to-optical conversion efficiency of NRZ modulation for a respective electro-optic modulator), C is the capacitance of the capacitive load (130), $V_{ss}$ is a voltage generated by a driver's voltage source (155), and $EO_{cap}$ is a voltage eye opening across the capacitive load (130) at a unity driver level $V_{sso}=1\ V_{pp}$. For more information regarding the voltage eye opening, see FIGS. 2.1 and 2.2 and the accompanying description.

FIGS. 2.1 and 2.2 show eye diagrams in accordance with one or more embodiments. An eye diagram may illustrate voltage measured across a particular circuit component, for example, a capacitive load. Specifically, an eye diagram may indicate the quality of a digital signal with respect to interference and/or distortion. The eye diagram in FIG. 2.1 shows a 28 Gbps NRZ signal for voltage measured across a capacitive load with a capacitance of 1000 femtoFarads. This eye diagram corresponds to the circuit in FIG. 1 with a uniform transmission line as in FIG. 1 having the same impedance as that of the driver. In FIG. 2.1, the horizontal axis for time (220) may be with respect to a unit interval (UI) of time. As such, one UI may be equal to one bit period. Furthermore, the vertical axis for voltage (225) in FIG. 2.1 may be with respect to the unity driver's voltage source (i.e., $V_{sso}$) level of 1.0 Vpp. Eye opening (210) shows little distortion (e.g., eye distortion A (211), eye distortion B (212)) from the overlapping waveforms. FIG. 2.2 illustrates an eye diagram in accordance with one or more embodiments having optimally tapered transmission line as in FIG. 4. In FIG. 2.2, voltage is measured across a capacitive load for a circuit similar to the one shown in FIG. 4. In FIG. 2.2, the horizontal axis for time (230) and the vertical axis for voltage (235) may correspond to time (220) and voltage (225) axes of FIG. 2.1.

Returning to FIG. 1, a voltage swing may be generated across the capacitive load (130) based on a driver voltage generated by the driver's voltage source (155). For example, the capacitive load (130) may have a predetermined power output for an 'on' state and another predetermined power output for an 'off' state (e.g., an 'on' state representing a binary bit '1' and an 'off' state representing a binary bit '0'). As such, the voltage swing may produce the 'on' and 'off' states in the capacitive load (130). In one or more embodiments, the interconnection of the transmission line (120) between the driver (160) and the bridged-T network (170) acts to increase the voltage swing at the capacitive load (130) for various capacitance values that may cause signal degradation in other circuits. In one or more embodiments, the voltage swing across the capacitive load (130) produces a change in electric power, mechanical displacement, signal phase, and/or temperature in a particular transducer.

Furthermore, the circuit (100) may act to suppress electrical reflections from the capacitive load (130), which may introduce signal ringing and distortion into the circuit (100). Likewise, the voltage swing may be configured for generation by CMOS or SiGe drivers with lower breakdown voltage, instead of more exotic GaAs or InP drivers. Driver output voltage swing $V_{ss}$ may be expressed by the following equation:

$$V_{ss} \sim \frac{V_{sso}}{C \cdot EO_{CAP}} \qquad \text{Equation 2}$$

where $EO_{CAP}$ is a normalized voltage eye opening for the capacitive load (130), C is the capacitance of the capacitive load, $V_{sso}$ is the unity driver voltage generating the $EO_{cap}$, and $V_{ss}$ is the driver output voltage swing. As shown in Equation 2, increasing the capacitance C with a fixed voltage eye opening $EO_{cap}$ and driver voltage $V_{sso}$ may produce a reduction in the driver output voltage swing $V_{ss}$ required for producing a fixed transducer output. With respect to power consumption and increasing the capacitance, the normalized power consumption $P_o$ of the circuit (100) corresponding to a normalized voltage source signal of $V_{sso}$ may be expressed by the following equation:

$$P_o = \frac{1}{T}\int_0^T V_{sso} I_o(t) dt = \frac{V_{sso}}{T}\int_0^T I_o(t) dt \qquad \text{Equation 3}$$

As such, the relationship between an average power consumption $P_{av}$ and the capacitance C may be expressed by the following equation:

$$P_{av} \sim \frac{P_o}{(C \cdot EO_{CAP})^2} \qquad \text{Equation 4}$$

where $P_o$ is the normalized average power consumption, C is the capacitance of the capacitive load (130), and $EO_{CAP}$ is a corresponding voltage eye opening. As such, increasing the capacitance of the capacitive load (130) may reduce the average power consumption of the circuit (100), presuming that the reduction may not cause a drastic reduction in eye opening $EO_{CAP}$. Thus, increasing transducer or electro-optic modulator capacitance may increase its signal conversion efficiency, thereby allowing a corresponding reduction in the driving voltage amplitude, which also may reduce power consumption. In one or more embodiments, for example, the capacitance of the capacitive load (130) is configured based on a specified transducer efficiency.

In one or more embodiments, the capacitive load (130) is a mechanical transducer. For example, the mechanical transducer may be a microelectromechanical system (MEMS) device. Specifically, the mechanical transducer may have an 'on' state or an 'off' state that corresponds to a particular mechanical displacement of the mechanical transducer, such as a rotation or acceleration. The change in the particular mechanical displacement from the 'on' state to an 'off' state, or vice versa, may be triggered by a voltage swing of a driver voltage across the mechanical transducer. In one or more embodiments, the mechanical transducer is a piezoelectric transducer. As such, the piezoelectric transducer may convert one or more electrical signals from a driver to generate a mechanical displacement between various piezo layers inside the piezoelectric transducer.

Figure 3:
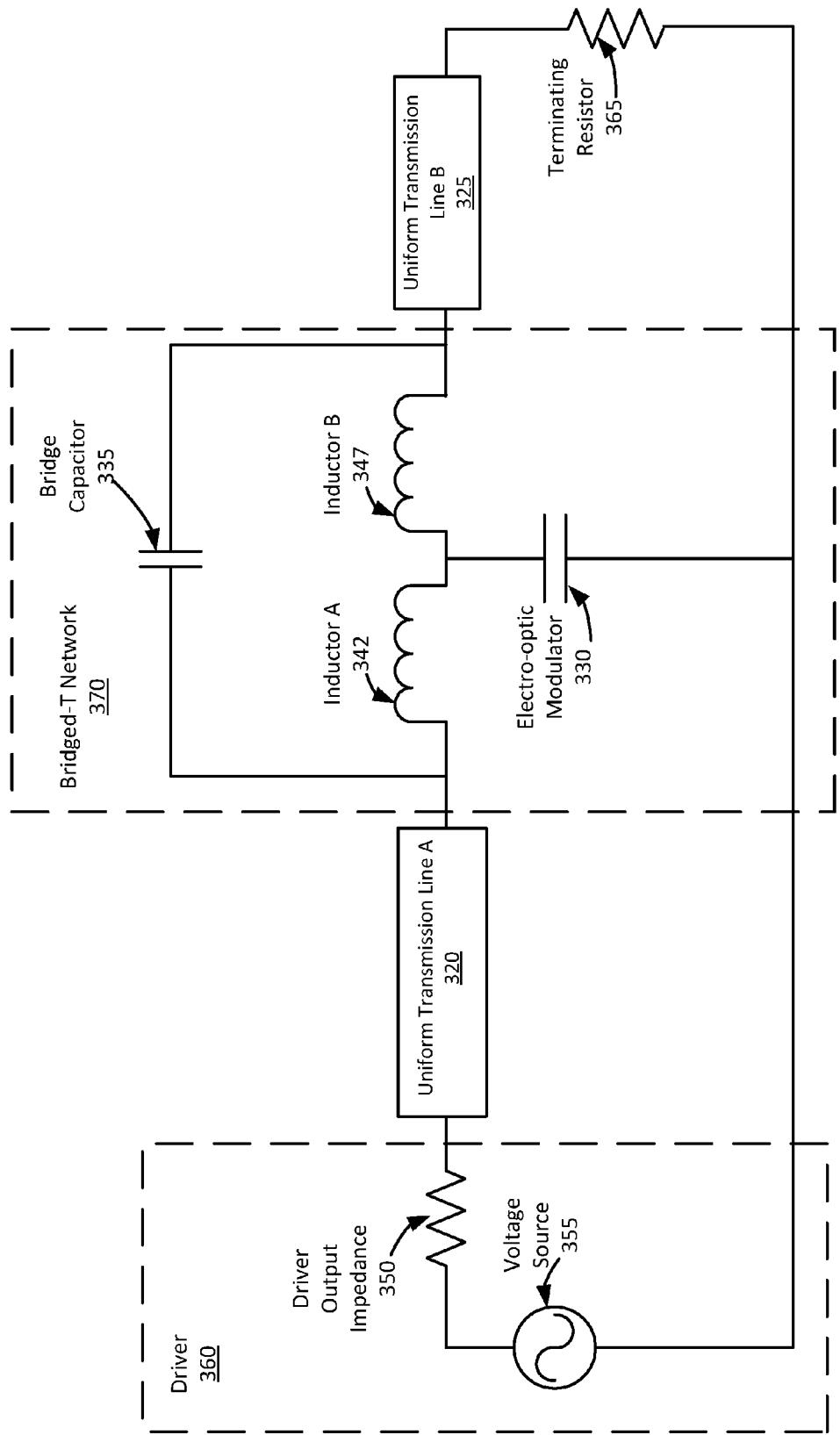
FIGS. 3 and 4 show examples in accordance with one or more embodiments.
Figure 4:
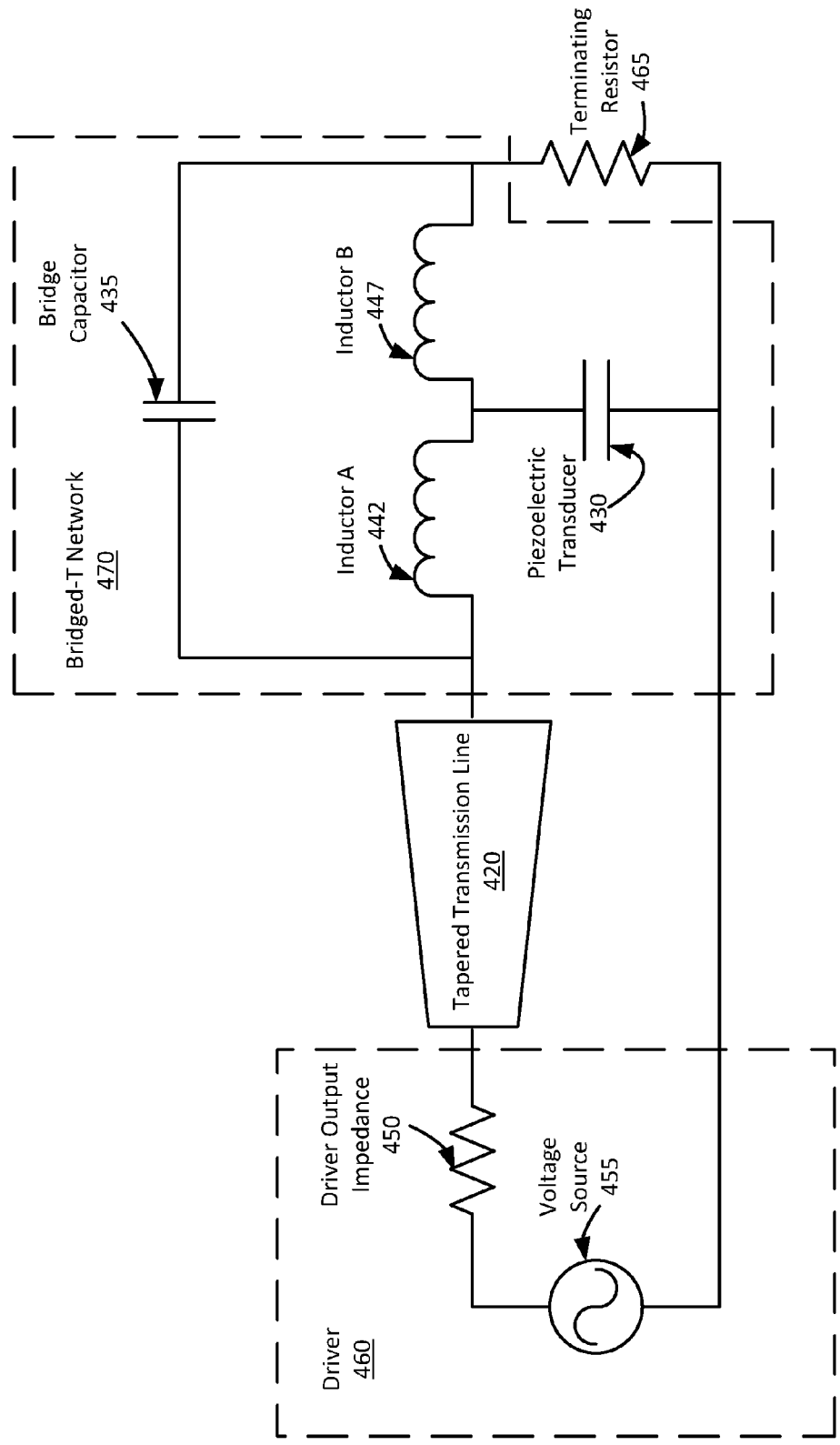

FIGS. 3 and 4 provide examples of circuits in accordance with one or more embodiments. The following examples are for explanatory purposes only and not intended to limit the scope of the invention.

In FIG. 3, a circuit is shown that includes a driver (360) having a voltage source (355) and a driver output impedance (350), a uniform transmission line A (320), a uniform transmission line B (325), a terminating resistor (365), and a bridged-T network (370) that may include an embedded electro-optic modulator (330), a bridge capacitor (335), an inductor A (342) and an inductor B (347). In one or more embodiments, the uniform transmission line A (320) and the uniform transmission line B (325) have uniform impedances throughout each transmission line. In one or more embodiments, the uniform transmission line A (320) is matched with the driver output impedance (350) for determining reflections towards the capacitive load represented by electro-optic modulator (330). In one or more embodiments, for determining a reflection from the bridged-T network's (370) side, the corresponding effective impedance is determined using the capacitance of the impedance values (e.g., capacitance) of the electro-optic modulator (330) and the other components in the bridged-T network (370). In one or more embodiments, inductor A (342) and inductor B (347) are not mutually coupled inductors. As such, inductor A (342) and/or inductor B (347) may have realistic values, such as from a microelectronic process used in CMOS fabrication.

In FIG. 4, a circuit is shown that includes a driver (460) having a voltage source (455) and a driver output impedance (450), a tapered transmission line (420), a bridged-T network (470) having capacitive load represented by an embedded piezoelectric transducer (430), and a terminating resistor (465). In one or more embodiments, the bridged-T network (470) includes a bridge capacitor (435), an inductor A (442), and an inductor B (447). In one or more embodiments, the tapered transmission line (420) has a higher impedance on the side of the driver (460) than the side of the bridged-T network (470) (i.e., the narrower part of the tapered transmission line (420) has a higher impedance value than the wider part of the tapered transmission line (420)). In one or more embodiments, the tapered transmission line (420) includes impedance values on each transmission line end that have realizable and practical values.

OPTIMIZATION OF MATCHING AND TERMINATION CIRCUITS FOR EMBEDDED CAPACITIVE LOADS

In general, embodiments of the invention include various circuits for accommodating the increasing capacitance of a capacitive load. The capacitive load may include an electro-optic modulator or other type of load that experiences increased performance based on increased capacitance. The circuits may include an electric driver for providing a driving voltage across the capacitive load. As such, the circuits may be configured with one or more inductor-and-capacitor (LC) ladder networks to act as matching circuits and/or termination circuits for embedding the capacitive load in close proximity to the electric driver.

Figure 5:
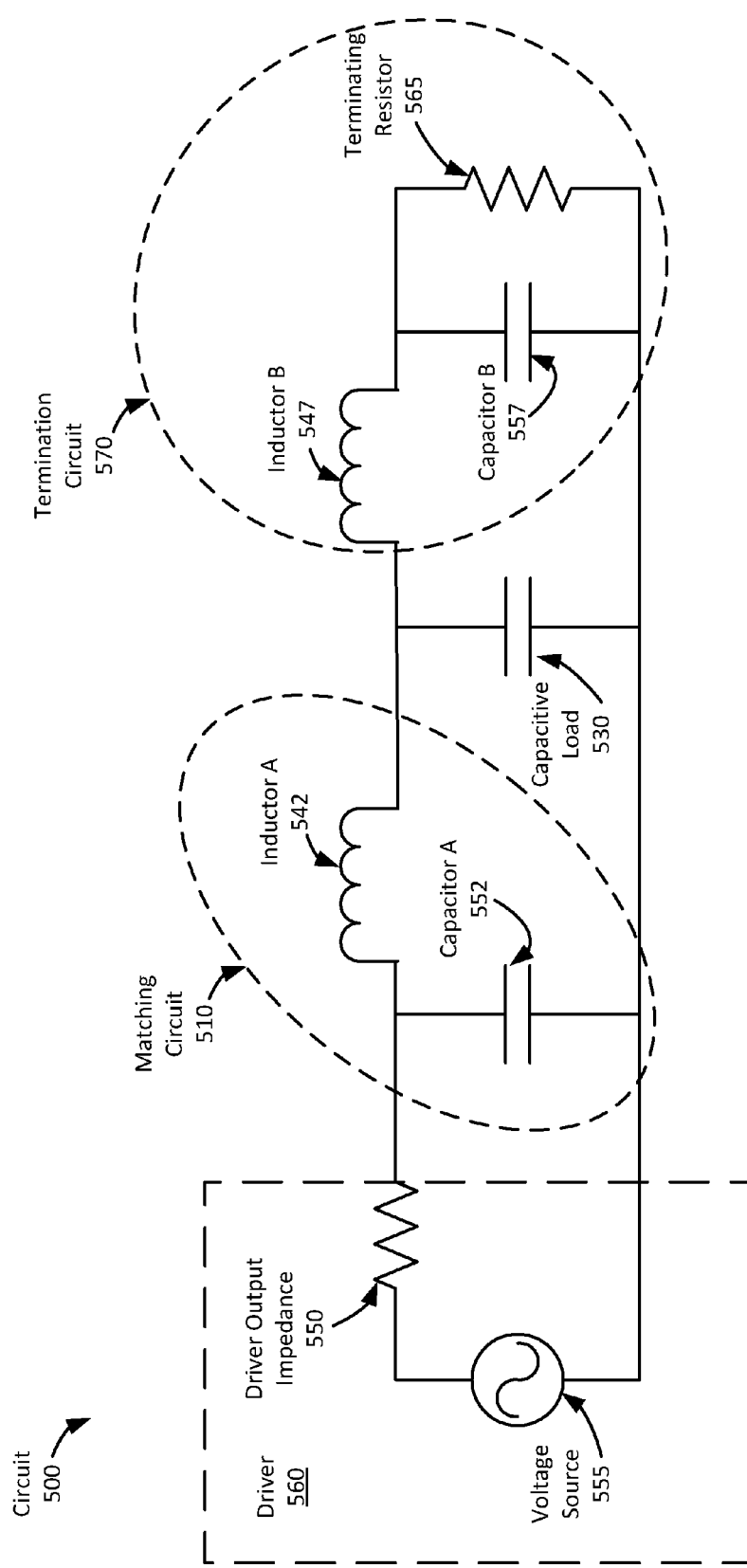
FIG. 5 shows a system in accordance with one or more embodiments.

FIG. 5 shows a schematic of a circuit (500) in accordance with one or more embodiments. In one or more embodiments, the circuit (500) includes a driver (e.g., driver (560)) having a voltage source (e.g., voltage source 555) and a driver output impedance (e.g., driver output impedance (550)), a capacitive load (e.g., capacitive load (530)), a matching circuit (e.g., matching circuit (510), and a termination circuit (e.g., termination circuit (570)). The matching circuit may be compensation circuitry configured as one or more inductor-and-capacitor (LC) ladder networks. An LC ladder network may include one or more inductors in series with one or more capacitors in parallel (e.g., inductor A (542) and capacitor A (552)). Furthermore, the termination circuit may be compensation circuitry configured as one or more LC ladder network configurations (e.g., inductor B (547) and capacitor B (557)) with a terminating resistor (e.g., terminating resistor (565)). As such, the capacitive load may be embedded in the circuit (500) between the matching circuit and the termination circuit. In one or more embodiments, the capacitive load (530) and the driver (560) are placed in close proximity in an assembly.

In one or more embodiments, the capacitive load (530) may be similar to the capacitive load (130) described with respect to FIG. 1. For example, the capacitive load (530) may include an electro-optic modulator or a piezoelectric transducer. As such, the capacitance of the capacitive load (530) may be based on a predetermined optical modulation amplitude or an electrical-to-optical conversion efficiency of an electro-optic modulator.

In one or more embodiments, the matching circuit (510) and/or the termination circuit (570) are implemented using radio frequency stubs. A radio frequency stub may include a series of transmission lines that may be short-circuited or open-circuited. In one or more embodiments, the capacitance of the matching circuit (510) and/or termination circuit (57) is configured using an open-circuit stub. In one or more embodiments, the inductance of the matching circuit (510) and/or termination circuit (570) is configured using a short-circuited stub. Specifically, an inductor in the circuit (500) may be implemented as a short-circuited high impedance stub. On the other hand, a capacitor in the circuit (500) may be implemented as an open-circuited low impedance stub.

In one or more embodiments, the matching circuit (510) and/or the termination circuit (570) is implemented using one or more transmission line series. As such, a transmission line series may include sequential short transmission line portions with differing impedances. For example, a short portion in the transmission line series may have a high impedance and may act as an inductor. Another short portion in the transmission line series may have a low impedance and may act as a capacitor. Specifically, a short transmission line portion may be a transmission line that is much shorter than a quarter wavelength at a particular frequency operated by the driver (560).

Figure 6:
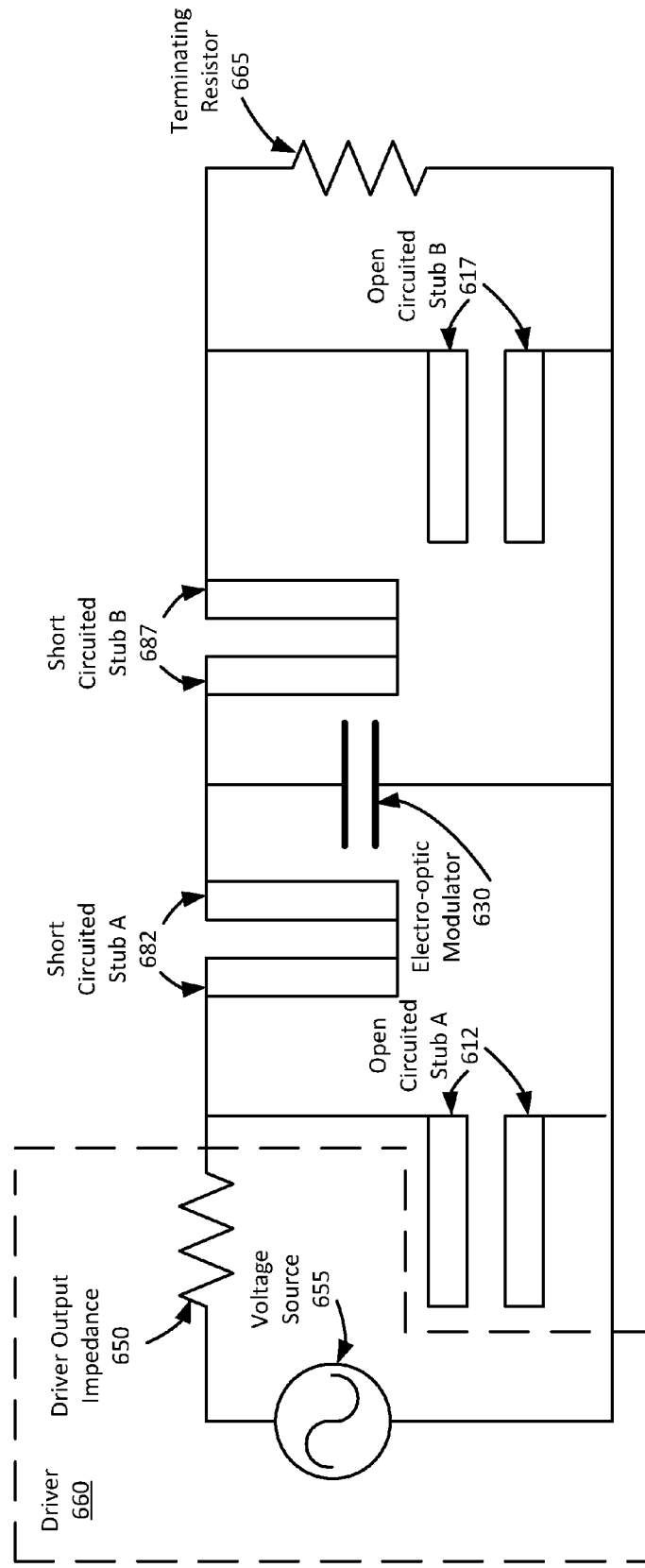
FIG. 6 shows an example in accordance with one or more embodiments

FIG. 6 provides an example of a circuit in accordance with one or more embodiments. The following example is for explanatory purposes only and not intended to limit the scope of the invention.

In FIG. 6, a circuit is shown that includes a driver (660) with voltage source (655) and a driver output impedance (650). The circuit includes a matching network that includes an open-circuited stub A (612) acting as a capacitor and a short-circuited stub A (682) acting as an inductor. The circuit also includes a termination network that includes a terminating resistor (665), an open-circuited stub B (617) acting as a capacitor and a short-circuited stub B (687) acting as an inductor. A capacitive load represented by electro-optic modulator (630) is embedded between the matching circuit and the termination circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A circuit, comprising:
   a circuit network comprising a capacitive load and a plurality of inductors, wherein the capacitive load has a predetermined capacitance;
   a first transmission line coupled to the circuit network;
   a resistor coupled to the circuit network, the resistor having a resistance value configured to produce a first impedance with the circuit network, and wherein the first impedance is configured to match substantially with a second impedance of the first transmission line; and
   an electric driver coupled to the first transmission line, wherein the electric driver is configured for transmitting a driving voltage to the capacitive load, and wherein the driving voltage is configured to generate a predetermined voltage swing across the capacitive load.

2. The circuit of claim 1, wherein the plurality of inductors within the circuit network have no mutual coupling.

3. The circuit of claim 1, wherein the circuit network comprises a bridged-T network.

4. The circuit of claim 1,
   wherein the capacitive load is a mechanical transducer, and
   wherein the voltage swing corresponds to a difference between a first power output of the mechanical transducer and a second power output of the mechanical transducer.

5. The circuit of claim 1, wherein the capacitive load is a microelectromechanical system (MEMS) device.

6. The circuit of claim 1, further comprising:
   wherein the electric driver and the capacitive load are separated by a predetermined distance within an assembly,
   wherein the first transmission line spans at least a portion of the predetermined distance, and
   wherein a material medium of the first transmission line is configured with a predetermined impedance based on the at least the portion of the predetermined distance.

7. The circuit of claim 1,
wherein the first transmission line is configured to produce a predetermined impedance mismatch with the bridged-T network, and
wherein the predetermined impedance mismatch is configured to generate a predetermined electrical reflection from the bridged-T network to the electric driver through the first transmission line.

8. The circuit of claim 1, wherein the predetermined capacitance is based on a predetermined transducer efficiency.

9. The circuit of claim 1, wherein the first transmission line is a tapered transmission line.

10. The circuit of claim 1, wherein the first transmission line is a microstrip.

11. The circuit of claim 1, further comprising:
a second transmission line coupled to the capacitive load; and
a terminating resistor coupled to the second transmission line.

12. The circuit of claim 1, wherein the predetermined capacitance corresponds to a gap between electrodes in the capacitive load.

13. A circuit, comprising:
a capacitive load configured with a first predetermined capacitance;
an electric driver, wherein the electric driver is configured for transmitting a driving voltage to the capacitive load, and wherein the driving voltage is configured to generate a predetermined voltage swing across the capacitive load;
a first inductor-and-capacitor (LC) ladder network compensation circuitry; and
a second LC ladder network compensation circuitry, wherein the first and second LC ladder network compensation circuitries are configured for matching the electric driver with the capacitive load.

14. The circuit of claim 13,
wherein the first LC ladder network circuitry comprises a second predetermined capacitance configured using an open-circuited stub.

15. The circuit of claim 13, wherein the first LC ladder network circuitry comprises a predetermined inductance configured using a short-circuited stub.

16. The circuit of claim 13, wherein the predetermined capacitance is configured based on a predetermined voltage eye opening across the capacitive load.

17. The circuit of claim 13,
wherein the capacitive load is a mechanical transducer, and
wherein the voltage swing corresponds to a difference between a first power output of the mechanical transducer and a second power output of the mechanical transducer.

18. The circuit of claim 13, wherein the capacitive load is a microelectromechanical system (MEMS) device.

* * * * *